(12) United States Patent
Usami

(10) Patent No.: US 6,670,709 B2
(45) Date of Patent: Dec. 30, 2003

(54) SEMICONDUCTOR DEVICE AND METHOD OF MANUFACTURING THE SAME

(75) Inventor: Tatsuya Usami, Tokyo (JP)

(73) Assignee: NEC Electronics Corporation, Kanagawa (JP)

(*) Notice: Subject to any disclaimer, the term of this patent is extended or adjusted under 35 U.S.C. 154(b) by 0 days.

(21) Appl. No.: 09/779,584

(22) Filed: Feb. 9, 2001

(65) Prior Publication Data

US 2001/0017402 A1 Aug. 30, 2001

(30) Foreign Application Priority Data

Feb. 10, 2000 (JP) ........................ 2000-033720

(51) Int. Cl.⁷ ................ H01L 23/485; H01L 23/532
(52) U.S. Cl. .................. 257/758; 257/734; 257/750; 257/635
(58) Field of Search ................. 257/301–304, 257/642, 758, 773–774, 646, 635, 734, 750; 438/637, 672, 675

(56) References Cited

U.S. PATENT DOCUMENTS

| | | | | |
|---|---|---|---|---|
| 5,182,231 A | * | 1/1993 | Hongo et al. | 437/173 |
| 5,604,696 A | * | 2/1997 | Takaishi | 365/149 |
| 5,880,018 A | * | 3/1999 | Boeck et al. | 438/619 |
| 6,037,668 A | * | 3/2000 | Cave et al. | 257/784 |
| 6,071,809 A | * | 6/2000 | Zhao | 438/634 |
| 6,222,269 B1 | * | 4/2001 | Usami | 257/758 |
| 6,252,303 B1 | * | 6/2001 | Huang | 257/758 |
| 6,265,780 B1 | * | 7/2001 | Yew et al. | 257/759 |
| 6,281,584 B1 | * | 8/2001 | Ngo et al. | 257/758 |
| 6,294,832 B1 | * | 9/2001 | Yeh et al. | 257/751 |
| 2003/0001277 A1 | * | 1/2003 | Noguchi et al. | 257/773 |
| 2003/0001280 A1 | * | 1/2003 | Noguchi et al. | 257/774 |

FOREIGN PATENT DOCUMENTS

| | | | |
|---|---|---|---|
| JP | 10-116904 | 5/1998 | |
| JP | 410189723 A | * 7/1998 | ......... H01L/21/768 |
| JP | 10-229122 | 8/1998 | |
| JP | 11-274296 | 10/1999 | |
| JP | 2000-323569 | 11/2000 | |
| JP | 2000-349153 | 12/2000 | |
| JP | 2001-605484 | 3/2001 | |
| JP | 2001-168192 | 6/2001 | |
| JP | 2001-189302 | 7/2001 | |

* cited by examiner

*Primary Examiner*—Nathan J. Flynn
*Assistant Examiner*—Johannes P. Mondt
(74) *Attorney, Agent, or Firm*—Sughrue Mion, PLLC (57) ABSTRACT

A first HSQ film composed of a Si—O-based film with a low dielectric constant is formed on a first wiring via a protective insulation film, and the surface of this first HSQ film is reformed to form a first SRO layer. Then, a second HSQ film is formed on this first SRO layer, and the surface of the second HSQ film is reformed to form a second SRO layer. Next, a via-hole is formed within a predetermined region, which reaches the protective insulation film on the first wiring. Then, wiring trenches forming a second wiring are formed within predetermined regions of the second HSQ film and the second SRO film while using the first SRO film as an etching stopper film. Thereafter, the protective insulation film at the bottom of the via-hole is etched and removed, and the wiring trenches and the via-hole are embedded with a conductive film. Then, the conductive film on the second SRO layer is removed while using the second SRO layer as a CMP stopper film.

7 Claims, 11 Drawing Sheets

HSQ FILM
$[HSiO_{3/2}]_n$

FIG. 5B

SRO FILM

MSQ FILM
$[CH_3SiO_{3/2}]_n$

FIG. 8B

REFORMED LAYER
($SiO_2$ FILM)

SEMICONDUCTOR DEVICE AND METHOD OF MANUFACTURING THE SAME

BACKGROUND OF THE INVENTION

1. Technical Field of the Invention

The present invention relates to a semiconductor device and a method of manufacturing the same, and in particular, a wiring structure using a film with a low dielectric constant and a method of manufacturing the same.

2. Description of the Related Art

In accordance with the microminiaturization of semiconductor devices, multilayer interconnection becomes necessary. Also, in accordance with the lowering of the voltage and speedup of operation of semiconductor devices, a lowering of the dielectric constant of the interlayer insulation film becomes necessary. Particularly, in logic-system semiconductor devices, an increase in resistance and an increase in parasitic capacitance between wires due to the microwiring lead to lowering of the operation speed of the semiconductor devices, so that multilayer interconnection using a film with a low dielectric constant as an interlayer insulation film becomes necessary in accordance with the microminiaturization.

Reductions in the wiring widths and wiring pitches increase the aspect ratio of the space between wires as well as the aspect ratio of the wires themselves, and as a result, it imposes a great cost burden on the technology for forming micro wiring which are thin and long in the vertical direction and on the technology for embedding the space in the micro wiring with an interlayer insulation film, and increases the number of processes as well as makes the manufacturing process of the semiconductor device complicated.

Therefore, trench wiring technology (damascene technology) by which wiring trenches are formed in the interlayer insulation film and wiring materials are embedded in the wiring trenches by using the chemical-mechanical polishing (CMP) method attracts much attention. However, in the formation of wiring trenches or formation of via-holes, the formation of a CMP stopper film or an etching stopper film becomes necessary.

As such a stopper film, an insulation film is used, whose etching speed is different from that of the interlayer insulation film in which wiring trenches or via-holes are formed. Therefore, a technology for using an insulation film with a low dielectric constant as the interlayer insulation film and using a silicon nitride film (SiN film) or a silicon oxynitride film (SiON film) as the stopper film has been variously studied. Such a technology is disclosed in, for example, Japanese Patent Laid-open Publications No. Hei 10-116904 and No. Hei 10-229122.

Figure 1:
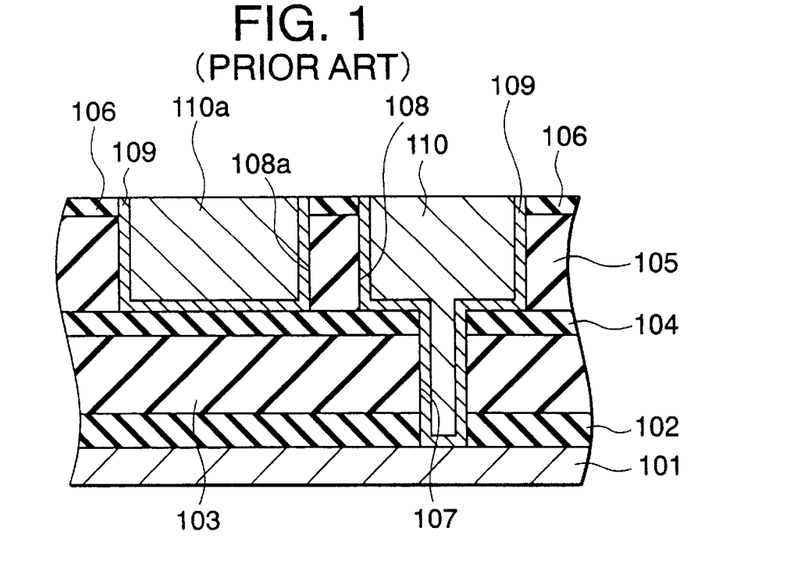
FIG. 1 is a sectional view showing the conventional semiconductor device having dual damascene wiring.

A semiconductor device shall be described in which wiring is formed by the conventional dual damascene technology using a silicon nitride film or a silicon oxynitride film as a stopper film and using a Si—O-based coating film as an interlayer insulation film. FIG. 1 is a sectional view showing the conventional semiconductor device having the dual damascene wiring, and FIG. 2A through FIG. 2G are sectional views showing the manufacturing method for the semiconductor device in the order of the processes.

As shown in FIG. 1, protective insulation film 102 and first HSQ (hydrogen silsesquioxane) film 103 are successively formed on first wiring 101 formed from, for example, an aluminum-copper alloy. Etching stopper film 104 is deposited on this first HSQ film 103. This etching stopper film 104 is a SiN film or a SiON film deposited by the chemical vapor deposition (CVD) method.

Then, second HSQ film 105 is formed on the etching stopper film 104, and CMP stopper film 106 is further deposited on the second HSQ film 105. This CMP stopper film 106 is a SiN film or a SiON film deposited by the CVD method as the etching stopper film 104. Or, this CMP stopper film 106 may be a silicon oxide film deposited by the CVD method. Wiring trenches 108 and 108a are formed in a predetermined region of the second HSQ film 105 and CMP stopper film 106, and the protective insulation film 102 at the bottom of the etching stopper film 104, the first HSQ film 103, and the wiring trench 108 are opened to form via-hole 107 reaching the surface of the first wiring 101. Barrier layer 109 is formed on the inner wall of this via-hole 107 and wiring trenches 108, 108a, and second wirings 110 and 110a are formed to cover the barrier layer 109 and embed in the via-hole 107, wiring trench 108, and wiring trench 108a.

Figure 2A:
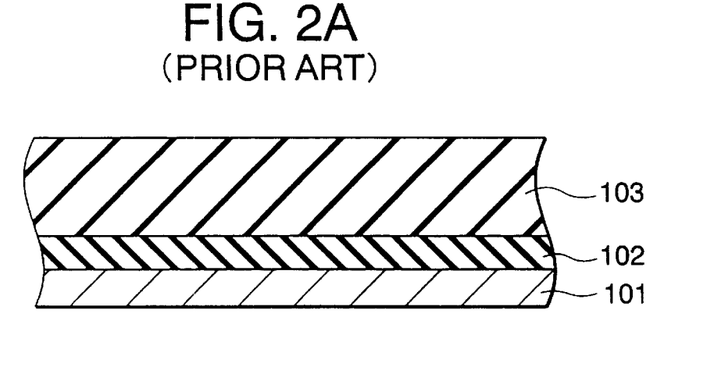
FIG. 2A through FIG. 2G are sectional views showing the method of manufacturing the conventional semiconductor device having dual damascene wiring in the order of the processes.

Next, the method of manufacturing a conventional semiconductor device which has dual damascene wiring shall be described. As shown in FIG. 2A, a first wiring 101 formed from an aluminum-copper alloy is formed on a semiconductor substrate (not shown). A silicon oxide film with a thickness of approximately 50 nm is deposited on this first wiring 101 by the plasma CVD method to form protective insulation film 102. Then, a coating solution to become an HSQ film is applied on the entire surface, fired at approximately 200° C., and further subjected to heat treatment at approximately 400° C. in a diffusion furnace. The first HSQ film 103 with a thickness of 350 nm is thus formed.

Figure 2B:
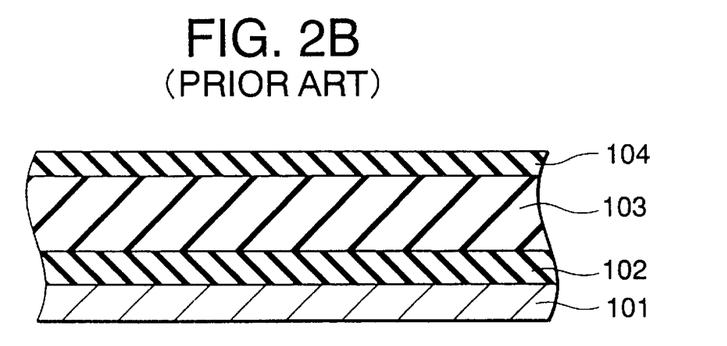

Next, as shown in FIG. 2B, a silicon nitride film with a thickness of approximately 50 nm is deposited all over by the plasma CVD method. Etching stopper film 104 is thus formed on the first HSQ film 103.

Figure 2C:
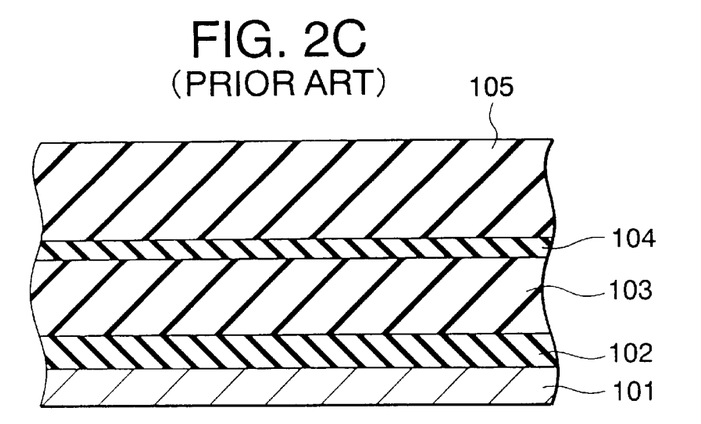

Then, as shown in FIG. 2C, second HSQ film 105 is formed on the etching stopper film 104. The thickness of the second HSQ film 105 is approximately 500 nm, and the method of forming this film is the same as that for the abovementioned first HSQ film 103.

Figure 2D:
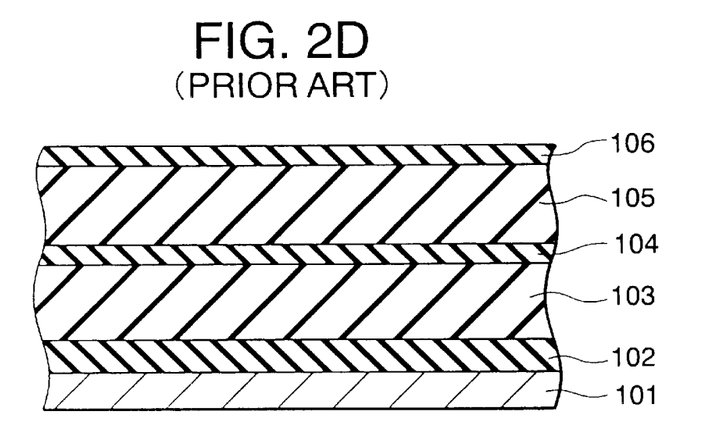

Next, as shown in FIG. 2D, a silicon oxide film with a thickness of approximately 50 nm is deposited on the entire surface by the plasma CVD method. CMP stopper film 106 is thus formed on the second HSQ film 105.

Figure 2E:
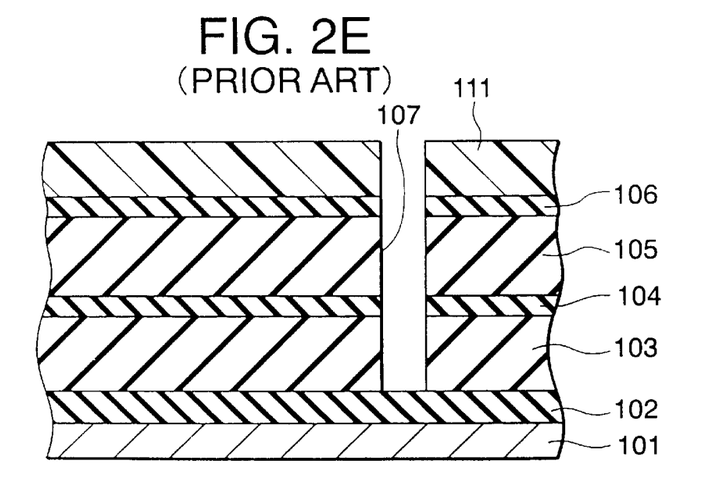

Next, as shown in FIG. 2E, first resist mask 111 is formed by the generally-known photolithography technique, and by using this first resist mask 111 as an etching mask, the CMP stopper film 106, the second HSQ film 105, the etching stopper film 104, and the first HSQ film 103 are dry-etched in order. Via-hole 107 to expose the surface of the protective insulation film 102 is thus formed.

Figure 2F:
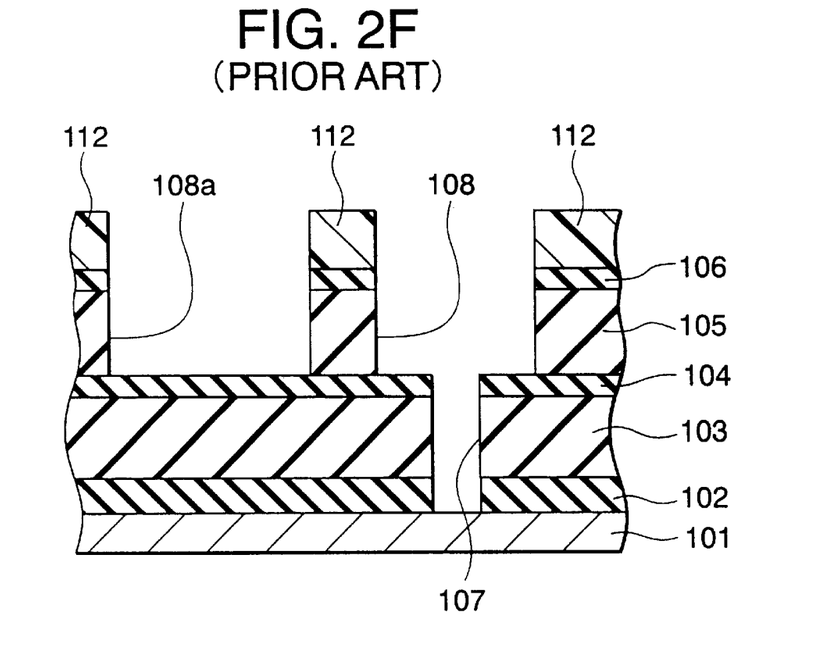

Next, as shown in FIG. 2F, second resist mask 112 having a wiring trench pattern is formed, and by using the second resist mask 112 as an etching mask, the CMP stopper film 106 and the second HSQ film 105 are dry-etched in order. Thus wiring trenches 108, 108a are formed. At this time, a dry-etching gas and its material are selected so as to increase the etching selection ratio of the second HSQ film 105 and the etching stopper film 104, that is, so as to make the etching speed of the second HSQ film 105 higher than that of the etching stopper film 104.

The first HSQ film 103 is protected from being dry-etched by the etching stopper film 104 in the abovementioned etching process. In this process, the exposed protective insulation film 102 is simultaneously etched, and the via-hole 107 reaches the surface of the first wiring 101.

Figure 2G:
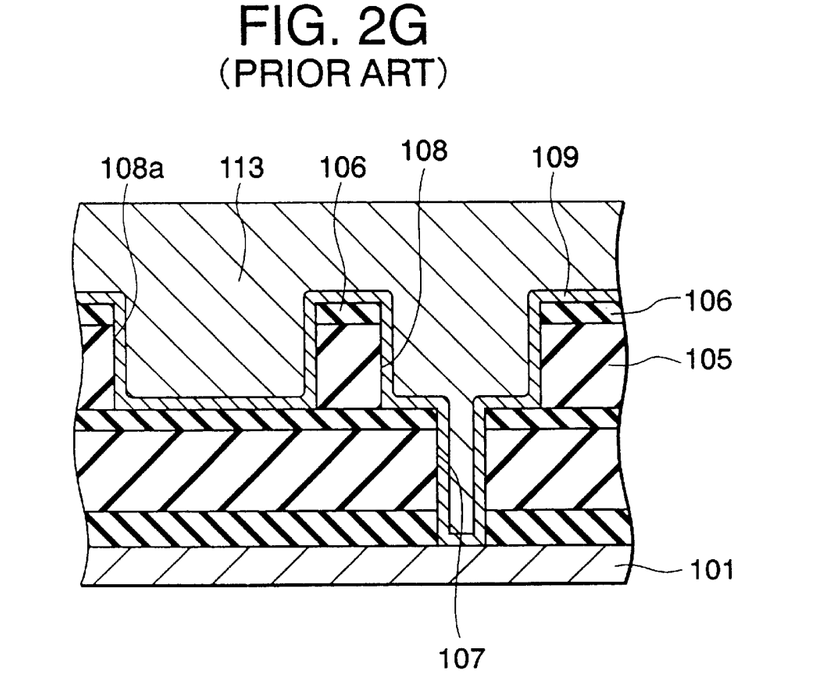

Next, as shown in FIG. 2G, the second resist mask 112 is removed. Then, a thin tantalum nitride (TaN) film is deposited on the entire surface by means of spattering to form barrier layer 109 on the inner walls of the via-hole 107 and the wiring trenches 108, 108a and on the surface of the CMP stopper film 106. Subsequently, a seed Cu film with a thickness of approximately 50 nm is deposited by means of spattering, and Cu film 113 with a thickness of approximately 1000 nm is further deposited by means of plating.

Next, not illustrated, the Cu film 113 and the barrier layer 109 are subjected to the CMP. In this CMP process, the second HSQ film 105 is protected from CMP by the CMP stopper film 106. The semiconductor device having the dual damascene wiring shown in FIG. 1 is thus formed.

However, in the prior-art mentioned above, the dielectric constant of the etching stopper film becomes high, and parasitic capacitance between the first wiring and the second wiring increases. In addition, as shown in FIG. 1, parasitic capacitance between the trench wiring 110 and the trench wiring 110a adjacent to each other increases due to the fringe effect between the same adjacent trenchs wiring via the etching stopper 104.

In the abovementioned example, the relative dielectric constant of the SiN film is 7 to 8, and the relative dielectric constant of the SiON film is approximately 5 to 6. This shows that these relative dielectric constants increases by two times or more the relative dielectric constant of the HSQ film which is approximately 3. Due to the increase in the parasitic capacitance between wirings, the operating speed of the semiconductor device, in particular, the operating speed of the logic-system semiconductor device lowers. Or, the formation of trench wiring by using a film with a low dielectric constant as the interlayer insulation film becomes impossible, and the lowering of the dielectric constant of the interlayer insulation film is limited. This is the first great problem.

A second problem is that a coating film with a low dielectric constant applied by an applying apparatus is used as a film with a low dielectric constant, and a film deposited by using a plasma CVD apparatus is used as an etching stopper film or a CMP stopper film, so that two manufacturing apparatuses becomes necessary, resulting in a huge capital investment cost.

A third problem is in that, when a Si—O based coating film having a methyl group such as the abovementioned MSQ (methyl silsesquioxane) film or MHSQ (methylated hydrogen silsesquioxane) film is used as the interlayer insulation film, adhesion between the MSQ film or MHSQ film and the silicon nitride film or silicon oxide film to be deposited on the MSQ or MHSQ film by the CVD method is poor, so that the CMP stopper film easily separates in the CMP process.

SUMMARY OF THE INVENTION

It is an object of the present invention to provide a semiconductor device and a method of manufacturing the same, wherein a Si—O based film with a low dielectric constant can be effectively used as an interlayer insulation film, the parasitic capacitance between the trench wirings can be reduced by a simple and easy method, and the number of manufacturing processes and the manufacturing cost of the semiconductor device are reduced.

A semiconductor device according to a first aspect of the present invention comprises: an interlayer insulation film having a reformed layer, formed at the surface of said interlayer insulation film, whose composition is changed from that of the inside of said interlayer insulation film; and a wiring formed on said reformed layer.

A semiconductor device according to a second aspect of the present invention comprises: a first interlayer insulation film having a reformed layer, formed at the surface of said first interlayer insulation film, whose composition is changed from that of the inside of said interlayer insulation film; a second interlayer insulation film formed on said reformed layer; a wiring trench formed in said second interlayer insulation film; and a wiring formed by embedding a conductive material in said wiring trench.

A semiconductor device according to a third aspect of the present invention comprises: a first interlayer insulation film having a first reformed layer, formed at the surface of said first interlayer insulation film, whose composition is changed from that of the inside of said first interlayer insulation film; a second interlayer insulation film having a second reformed layer, formed at the surface of said second interlayer insulation film, whose composition is changed from that of the inside of said second interlayer insulation film; a wiring trench formed in said second interlayer insulation film; and a wiring formed by embedding a conductive material in said wiring trench.

A semiconductor device according to a fourth aspect of the present invention comprises: a first interlayer insulation film having a first reformed layer, formed at the surface of said first interlayer insulation film, whose composition is changed from that of the inside of said first interlayer insulation film; a via-hole formed in said first interlayer insulation film; a via-hole formed by embedding a conductive material in said via-hole; a second interlayer insulation film having a reformed layer, formed at the surface of said second interlayer insulation film, whose composition is changed from that of the inside of said second interlayer insulation film; a wiring trench formed in said second interlayer insulation film; and a wiring formed by embedding the conductive material in said wiring trench.

Herein, the abovementioned interlayer insulation films including the first interlayer insulation film and the second interlayer insulation film are composed of silsesquioxanes or porous silica having one or more bonds selected from a group consisting of a Si—H bond, a Si—CH$_3$ bond, and a Si—F bond, and the abovementioned reformed layers are composed of a silicon oxide film or a silicon dioxide film containing excess silicon. The above silsesquioxanes include hydrogen silsesquioxane, methyl silsesquioxane, methylated hydrogen silsesquioxane, and fluorinated silsesquioxane.

A method of manufacturing a semiconductor device according to a first aspect of the present invention comprises the steps of: forming an interlayer insulation film composed of silsesquioxanes or porous silica having one or more bonds selected from a group consisting of a Si—H bond, a Si—CH$_3$ bond, and a Si—F bond; and forming a reformed layer made of a silicon oxide layer containing excess silicon or a silicon dioxide layer by irradiating a charged beam onto the surfaces of said interlayer insulation film to reform the surface of said interlayer insulation film.

A method of manufacturing a semiconductor device according to a second aspect of the present invention comprises the steps of: forming a first interlayer insulation film composed of silsesquioxanes or porous silica having one or more bonds selected from a group consisting of a Si—H bond, a Si—CH$_3$ bond, and a Si—F bond; forming a reformed layer at the surface of said first interlayer insulation film by irradiating a charged beam onto the surface of said first interlayer insulation film; forming a second interlayer insulation film on said first reformed layer; forming a wiring trench in said second interlayer insulation film; and embedding a conductive film in said wiring trench.

A method of manufacturing a semiconductor device according to a third aspect of the present invention comprises the steps of: forming a first interlayer insulation film composed of silsesquioxanes or porous silica having one or more bonds selected from a group consisting of a Si—H bond, a Si—CH$_3$ bond, and a Si—F bond; forming a first reformed layer at the surface of said first interlayer insulation film by irradiating a charged beam onto the surface of said first interlayer insulation film; forming a second interlayer insulation film on said first reformed layer compose of silsesquioxanes or porous silica having one or more bonds selected from a group consisting of a Si—H bond, a Si—CH$_3$ bond, and a Si—F bond; forming a second reformed layer at the surface of said first interlayer insulation film by irradiating a charged beam onto the surface of said second interlayer insulation film; forming a wiring trench in said second reformed layer and said second interlayer insulation film; and embedding a conductive film in said wiring trench.

A method of manufacturing a semiconductor device according to a fourth aspect of the present invention comprises the steps of: forming a first interlayer insulation film composed of silsesquioxanes or porous silica having one or more bonds selected from a group consisting of a Si—H bond, a Si—CH$_3$ bond, and a Si—F bond; forming a first reformed layer at the surface of said first interlayer insulation film by irradiating a charged beam onto the surface of said first interlayer insulation film; forming a second interlayer insulation film on said first interlayer insulation film, which is composed of silsesquioxanes or porous silica having one or more bonds selected from a group consisting of a Si—H bond, a Si—CH$_3$ bond, and a Si—F bond; forming a second reformed layer at the surface of said second interlayer insulation film by irradiating a charged beam onto the surface of said second interlayer insulation film; forming a via-hole in said first reformed layer, said first interlayer insulation film, said second reformed layer, and said second interlayer insulation film; forming a wiring trench in said second reformed layer and said second interlayer insulation film; and embedding a conductive film in said via-hole and said wiring trench.

In the present invention, the first reformed layer is used as an etching stopper layer to protect the first interlayer insulation film, and the second interlayer insulation film is selectively dry-etched to form the wiring trenches. Furthermore, the second reformed layer is used as a chemical-mechanical polishing (CMP) stopper layer to protect the second interlayer insulation film, and the via-hole and the wiring trenches can be embedded with a conductive film through the chemical-mechanical polishing.

The silsesquioxanes include hydrogen silsesquioxane, methyl silsesquioxane, methylated hydrogen silsesquioxane, and fluorinated silsesquioxane, and the first reformed layer and the second reformed layer are composed of silicon oxide films or silicon dioxide films containing excess silicon. The charged beam is composed of an ionized rare gas or oxygen gas.

In the invention, a film with a low dielectric constant composed of a Si—O based coating film or the like is used as the interlayer insulation film between the wirings, and the surface of the interlayer insulation film is reformed by irradiation of a charged beam to form a reformed layer with a relatively low dielectric constant on the surface. In the formation of damascene wiring or dual damascene wiring, this reformed layer can be used as an etching stopper film or CMP stopper film as it is. This reformed layer has a structure, which gradually reforms at the interface from the interlayer insulation film, so that the adhesion between the reformed layer and the interlayer insulation film is extremely high. Therefore, the Si—O-based film with a low dielectric constant can be used for the interlayer insulation film, and parasitic capacitance between wiring can be easily reduced. Furthermore, the problem of separation of the stopper film in the CMP process as mentioned above in the prior-art is completely eliminated. Moreover, the formation of the reformed layers is easily performed by irradiation of charged beams, so that the manufacturing cost for the semiconductor device can be easily reduced. Thus, according to the invention, realization of high integration, high speed, and multifunction in accordance with microminiaturization of the semiconductor device can be promoted.

THE PREFERRED EMBODIMENTS OF THE INVENTION

The semiconductor device and the method of manufacturing the same in accordance with each preferred embodiment of the invention are explained in detail with reference to the attached drawings.

Figure 3:
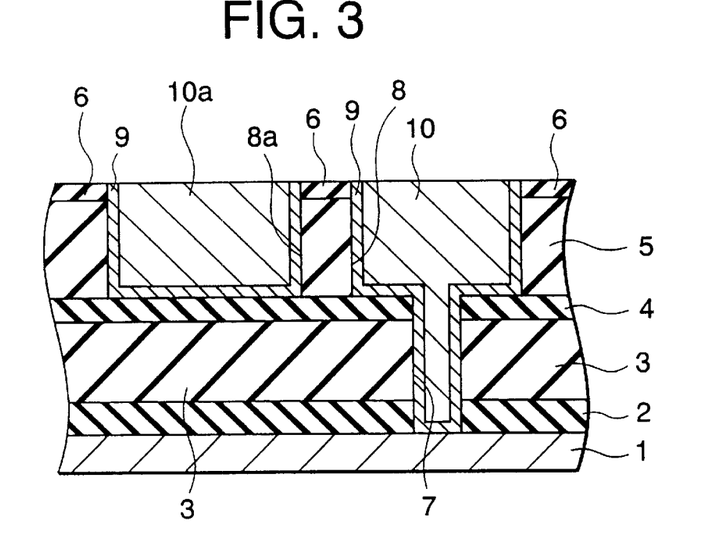
FIG. 3 is a sectional view showing the semiconductor device in accordance with a first embodiment of the invention.

FIG. 3 is a sectional view showing the semiconductor device in accordance with the first embodiment of the invention. In the present embodiment, a semiconductor device having dual damascene wiring as in the abovementioned prior-art (hereinafter, referred to as a conventional example) is described.

As shown in FIG. 3, as in the conventional example shown in FIG. 1, protective insulation film 2 and first HSQ film 3 are formed on first wiring 1. This first HSQ film 3 is a first interlayer insulation film. A silicon oxide layer, that is, first SRO (Si-rich-oxide) layer 4 which contains excess silicon is formed on the surface of this first HSQ film 3. This first SRO layer 4 is a reformed layer obtained by reforming the surface layer of the first HSQ film 3, and functions as an etching stopper film.

Second HSQ film 5 is formed on the first SRO layer 4. Herein, the second HSQ film 5 is a second interlayer insulation film. Furthermore, a second SRO layer 6 is formed on the second HSQ film 5. This second SRO layer 6 functions as a CMP stopper film in the conventional example mentioned above. The second SRO layer 6 is a reformed layer obtained by reforming the surface of the second HSQ film 5.

Wiring trenches 8 and 8a are formed in predetermined regions of the second HSQ film 5 and the second SRO layer 6, and via-hole 7 is formed in the first HSQ film 3 and the first SRO layer 4, which reaches the surface of the first wiring 1. As in the conventional example, barrier layer 9 and second wirings 10 and 10a are formed in the via-hole 7 and wiring trenches 8 and 8a to form dual damascene wiring.

Next, a method of manufacturing the semiconductor device having dual damascene wiring of the present embodiment is explained. FIG. 4A through FIG. 4G are sectional views showing the manufacturing method of the present embodiment in the order of the processes.

Figure 4A:
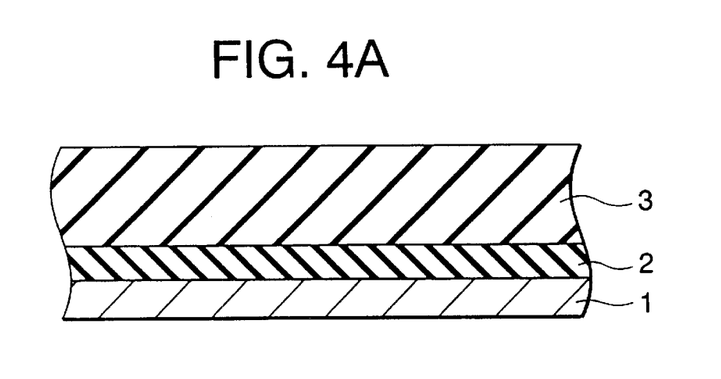
FIG. 4A through FIG. 4G are sectional views showing the method of manufacturing the semiconductor device in accordance with the first embodiment of the invention in the order of the processes.

As shown in FIG. 4A, a first wiring 1 made of, for example, a Cu film or the like is formed on the surface of the insulation film (not shown) on the semiconductor substrate. Protective insulation film 2 with a thickness of, for example, approximately 50 nm is formed on this first wiring 1. The protective insulation film 2 is, for example, a SiC film or the like which has a relative dielectric constant of approximately 5 and insulation performance. Next, by the same method as in the conventional example, first HSQ film 3 with a thickness of, for example, approximately 500 nm is formed.

Figure 4B:
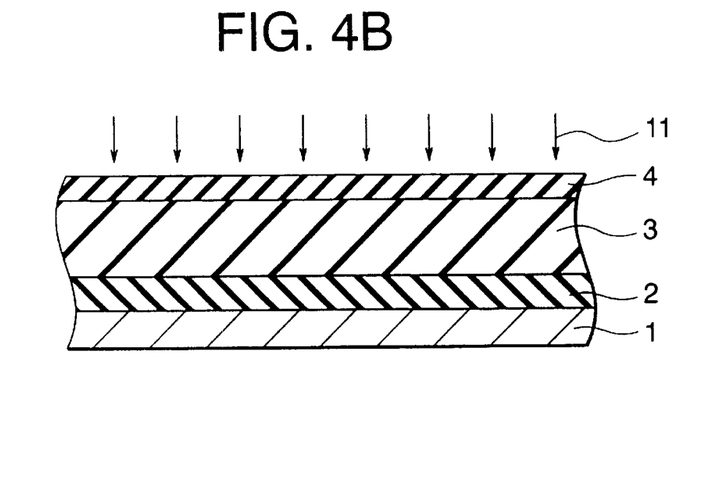

Next, as shown in FIG. 4B, argon ions 11 are irradiated onto the surface of the first HSQ film 3. By this irradiation of the argon ions 11, the Si—H bond of the surface of the first HSQ film 3 is cut off. Thus, the surface of the first HSQ film 3 is reformed to form first SRO layer 4. The thickness of this first SRO layer is, for example, approximately 50 nm. The SRO layer 4 formed by this surface reformation is explained in detail later with reference to FIG. 5.

Figure 4C:
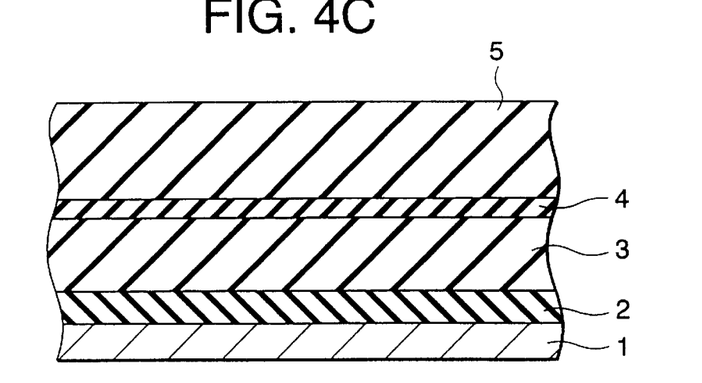

Next, as shown in FIG. 4C, second HSQ film 5 with a thickness of, for example, approximately 500 nm is formed on the first SRO layer 4. The method of forming this second HSQ film may be the same as that for the first HSQ film 103.

Figure 4D:
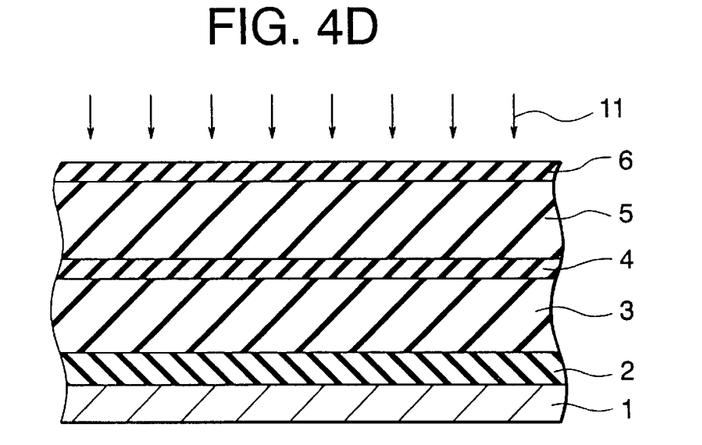

Then, as shown in FIG. 4D, the argon ions 11 are irradiated onto the surface of the second HSQ film 5 to reform the surface of the second HSQ film 5, whereby second SRO layer 6 with a thickness of, for example, approximately 50 nm is formed.

Figure 4E:
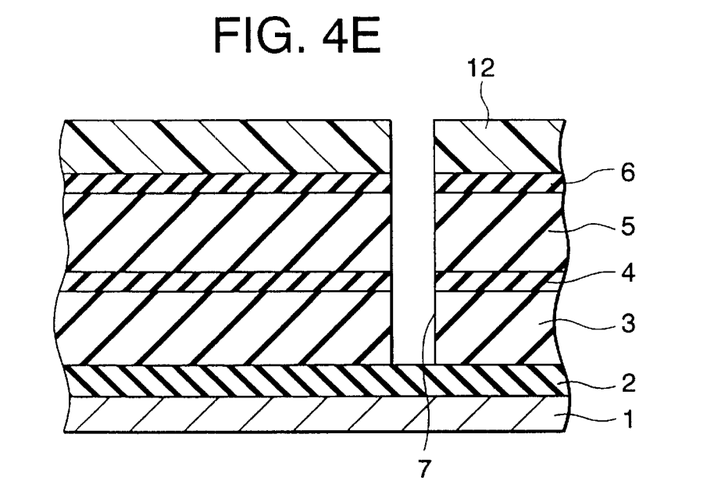

Subsequently, as shown in FIG. 4E, first resist mask 12 is formed by the generally-known photolithography technique, and by using this first resist mask 12 as an etching mask, the second SRO layer 6, the second HSQ film 5, the first SRO layer 4, and the first HSQ film 3 are successively dry-etched. At this time, the second SRO layer 6 and the first SRO layer 4 may be dry-etched in plasma in which a mixed gas made from a $CF_4$ gas and a $O_2$ gas has been plasma-enhanced. Also, the second HSQ film 5 and the first HSQ film 3 may be etched by means of RIE of ions within a reactant gas in which a mixed gas of a $C_4F_8$ gas, an $O_2$ gas, and an Ar gas has been plasma-enhanced. Via-hole 7 is thus formed.

Figure 4F:
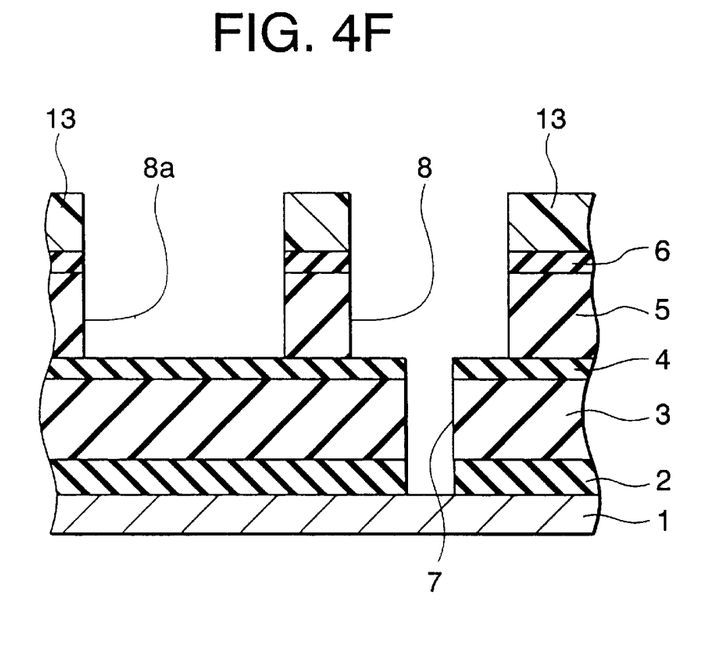

Hereinafter, in the same manner as that of the conventional example, as shown in FIG. 4F, second resist mask 13 having a wiring trench pattern is formed, and by using this resist mask 13 as an etching mask, the second SRO layer 6 and the second HSQ film 5 are dry-etched. At this time, in the dry-etching of the second HSQ film 5, a reactant gas in which a mixed gas made from a $C_4F_8$ gas, an $O_2$ gas, and an Ar gas has been plasma-enhanced may be used. In this reactant gas, if the ratio of content of the $O_2$ gas to the $C_4F_8$ gas is increased, the ratio of (the etching speed of the second HSQ film 5)/(the etching speed of the first SRO layer 4), that is, the etching selection ratio becomes approximately 20. Thus, in the abovementioned RIE process, the first HSQ film 3 is protected from being dry-etched by the first SRO layer 4.

Next, the second resist mask 13 is removed by means of ashing, and then the exposed protective insulation film 2 is etched by means of RIE, whereby the surface of the first wiring 1 is exposed to the bottom of the via-hole 7. At this time, for the dry-etching of the protective insulation film 2, a reactant gas in which a mixed gas made from a $C_4F_8$ gas and an $O_2$ gas has been plasma-enhanced may be used. If such a reactant gas is used, the ratio of (the etching speed of the protective insulation film 2 made of a SiC film having insulation performance)/(the etching speed of the first SRO layer 4) and the ratio of (the etching speed of the protective insulation film 2 made of a SiC film having insulation performance)/(the etching speed of the second SRO layer 6) becomes approximately 20. Thus, the first HSQ film 3 and the second HSQ film 5 are protected from being etched even in this RIE process.

Figure 4G:
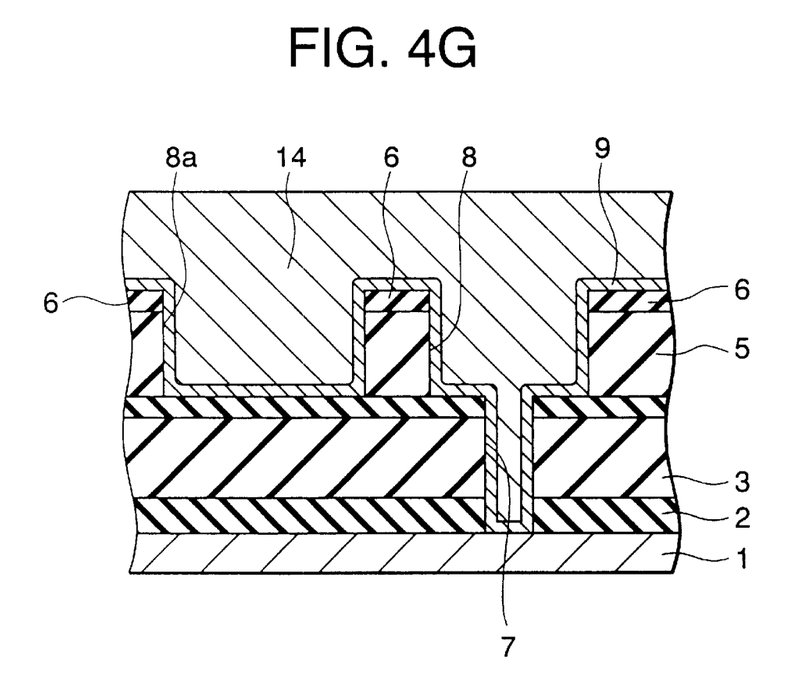

Subsequently, as shown in FIG. 4G, barrier layer 9 is formed on the inner walls of the via-hole 7 and the wiring trench 8 and the surface of the SRO layer 6. Then, in the same manner as that of the conventional example, Cu film 14 with a thickness of, for example, approximately 1000 nm is deposited on the entire surface.

Then, not illustrated, the Cu film 14 and the barrier layer 9 are subjected to CMP. In this CMP process, the second SRO layer 6 functions as a CMP stopper film to protect the second HSQ film 5 from CMP. The semiconductor device having dual damascene wiring shown in FIG. 3 is thus formed.

Figure 5A:
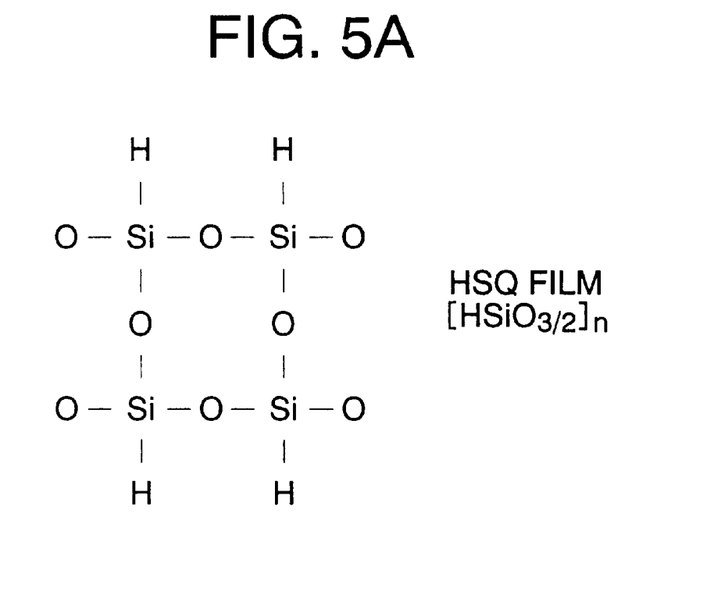
FIG. 5A is a structural formula showing the structure of an HSQ film.
Figure 5B:
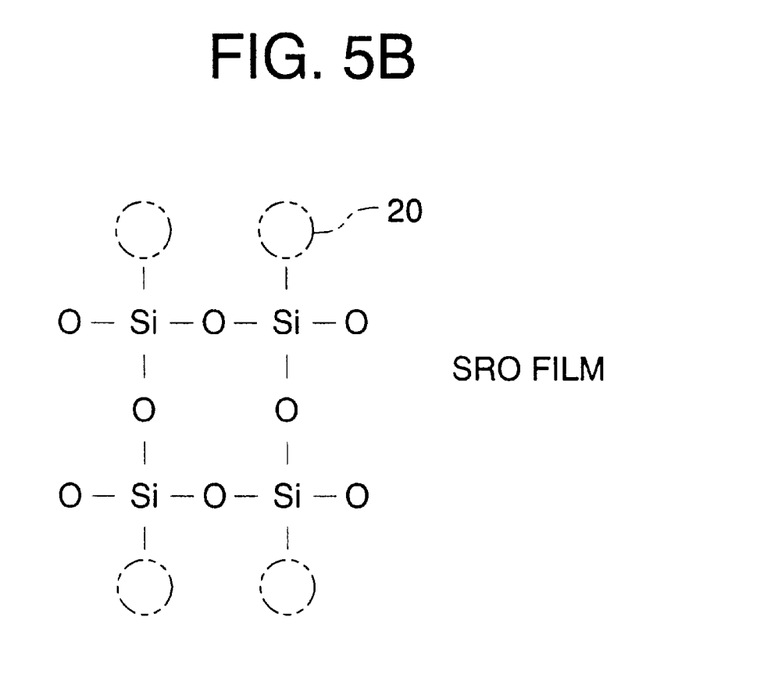
FIG. 5B is a structural formula showing the structure of a SRO film.

Next, the reformation of the surfaces of the HSQ films 3 and 5 and its effect are explained. FIG. 5A is a structural formula showing the structure of the HSQ film, and FIG. 5B is a structural formula showing the structure of the SRO film. As shown in FIG. 5A, the HSQ film has the structure of $[HsiO_{3/2}]$. When a charged beam such as argon ions is irradiated onto the surface of this HSQ film, as shown in FIG. 5B, the Si—H bond is cut off. Thereby, a non-bonded portion (dangling bond) is generated in Si. If many Si dangling bonds are generated, the composition of the surface of the HSQ film changes and becomes close to $SiO_{3/2}$. Then, the surface becomes a SRO film containing more excess silicon than that of a silicon dioxide ($SiO_2$) film having a stoichiometric content value. The relative dielectric constant of such a SRO film is approximately 4.5. Therefore, the relative dielectric constant of a silicon nitride film is approximately 7.5, and the relative dielectric constant of a silicon oxynitride film is 5.5, and on the other hand, the relative dielectric constant is lowered if this SRO film is used.

In such reformation of the surface of the HSQ film, the HSQ film does not rapidly changes into a SRO film. The present inventors confirmed that there was a transition range between the HSQ film and the SRO film, and the transition of the HSQ film into the SRO film gradually proceeded. Therefore, the adhesion between the HSQ film and the SRO film is extremely high.

In the abovementioned irradiation of argon ions, for example, an argon gas is plasma-enhanced by an ECR (electron cycrotron resonance) device to extract plasma ions at an acceleration voltage of several hundreds eV, and then argon ions having the abovementioned kinetic energy are irradiated. Herein, a rare gas such as neon may be used in place of argon. It is preferable that the dosage of plasma ions in this case is set to $10^{14}/cm^2$ to $10^{16}/cm^2$. Also, the surface of the HSQ film may be reformed by irradiation of an electronic beam.

In the present embodiment, the HSQ films 3 and 5 as films with low dielectric constants made of Si—O-based coating films or the like are used for the interlayer insulation films between the wirings, and the surfaces of the interlayer insulation films are reformed by irradiation of a charged beam to form SRO layers 4 and 6 on the surfaces, which are reformed layers with relatively low dielectric constants. These SRO layers 4 and 6 can be used as etching stopper films or CMP stopper films as they are in the formation of damascene wiring or dual damascene wiring, and the dielectric constants of these reformed layers that are the SRO layers 4 and 6 are smaller than that of a conventional etching stopper film or CMP stopper film, so that the Si—O-based films with low dielectric constants can be effectively used for the interlayer insulation films between wiring. Thereby, reduction in the parasitic capacitance between wiring such as damascene wiring becomes extremely easy.

The SRO layers 4 and 6 of the reformed layers have a structure in which they gradually reform at the interfaces from the HSQ films 3 and 5, and the adhesion between the HSQ films 3, 5 and the SRO layers 4, 6 is extremely high. Therefore, the problem of separation of the stopper films in the CMP process for manufacturing damascene wiring in the prior-art is completely eliminated. These reformed layers, the SRO layers 4 and 6 are easily formed by irradiation of a charged beam or the like as mentioned above, so that the manufacturing cost of the semiconductor device is easily reduced.

Figure 6:
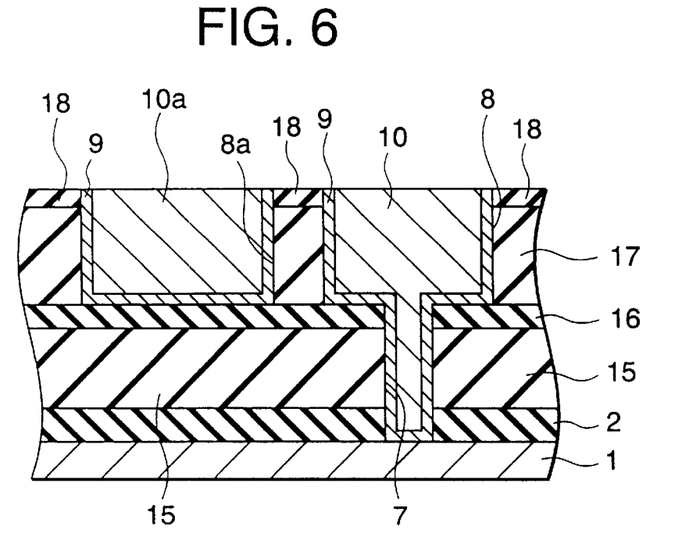
FIG. 6 is a sectional view showing the semiconductor device in accordance with a second embodiment of the invention.

Next, the second embodiment of the invention is explained. Also in the present embodiment, as in the first embodiment, a semiconductor device having dual damascene wiring is described. FIG. 6 is a sectional view showing the semiconductor device of the present embodiment, and FIG. 7A through FIG. 7G are sectional views showing the manufacturing method in the order of the processes. In the present embodiment shown in FIG. 6 and FIG. 7, the components which are the same as those of the first embodiment have the same symbols attached to them, and detailed description thereof is omitted.

As shown in FIG. 6, as in the conventional example, first wiring 1 made from an aluminum-copper alloy is formed on the surface of the insulation film (not shown) on the semiconductor substrate, and protective insulation film 2 and first MSQ film 15 are formed in order on the first wiring 1. This first MSQ film 15 is the first interlayer insulation film. Then, the surface of the first MSQ film 15 is reformed and first reformed layer 16 which is a silicon oxide layer is formed. This first reformed layer 16 functions as an etching stopper film. Second MSQ film 17 is formed on the first reformed layer 16. This second MSQ film 17 is a second interlayer insulation film. Furthermore, second reformed layer 18 is formed on the second MSQ film 17. This second reformed layer 18 has the same function as that of the CMP stopper film of the conventional example. The second reformed layer 18 is a silicon oxide layer formed by reforming the surface of the second MSQ film 17.

Wiring trenches 8 and 8a are formed in predetermined regions of the second MSQ film 17 and the second reformed layer 18, and the first reformed layer 16, the first MSQ film 15, and the protective insulation film 2 at the bottom of the wiring trench 8a are opened to form via-hole 7 reaching the surface of the first wiring 1. Other points in the construction are the same as those of the conventional example, wherein barrier layer 9 and second wirings 10 and 10a are formed within the trenches 8 and 8a and via-hole 7 to form dual damascene wiring.

Figure 7A:
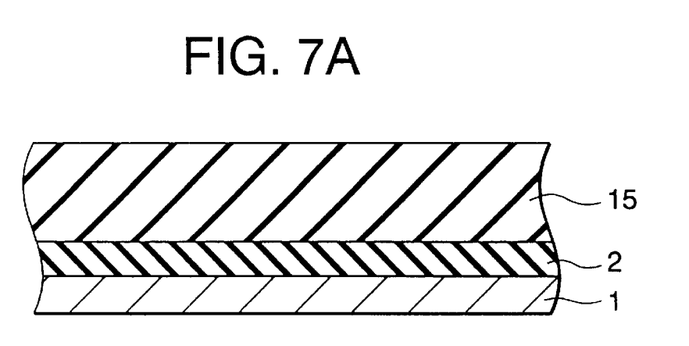
FIG. 7A through FIG. 7G are sectional views showing the method of manufacturing the semiconductor device in accordance with the second embodiment of the invention in the order of the processes.

Next, the method of manufacturing this semiconductor device having dual damascene wiring is explained. As shown in FIG. 7A, the first wiring 1 is formed of an aluminum-copper alloy film. The protective insulation film 2 with a thickness of, for example, approximately 50 nm is formed on this first wiring 1, entirely applied with a coating solution to form an MSQ film, fired at approximately 150° C., and further subjected to heat treatment in a diffusion furnace at approximately 400° C. The first MSQ film 15 with a thickness of, for example, approximately 500 nm is thus formed.

Figure 7B:
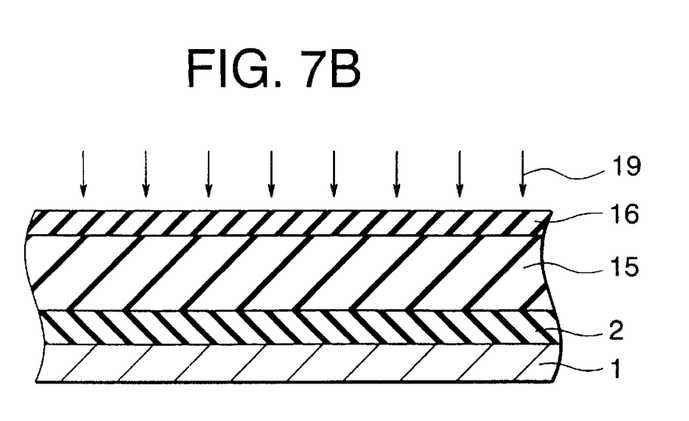

Next, as shown in FIG. 7B, oxygen ions 19 are irradiated onto the surface of the first MSQ film 15. By this irradiation of the oxygen ions 19, the Si—$CH_3$ bond of the MSQ film is cut off and a Si—O bond is generated. Thus, the surface of the first MSQ film 15 is reformed to form a silicon oxide layer (first reformed layer) 16. The thickness of this first reformed layer 16 is, for example, approximately 50 nm. This surface reformation is explained in detail later with reference to FIG. 8.

Figure 7C:
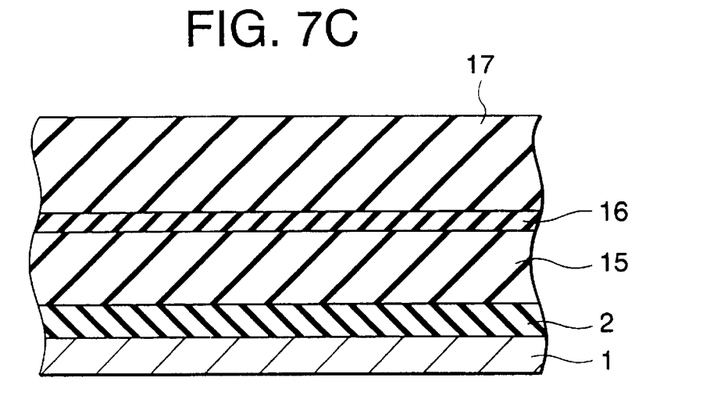

Next, as shown in FIG. 7C, the second MSQ film 17 with a thickness of, for example, approximately 500 nm is formed on the first reformed layer 16. The method of forming this second MSQ film 17 is the same as that for the first MSQ film 15.

Figure 7D:
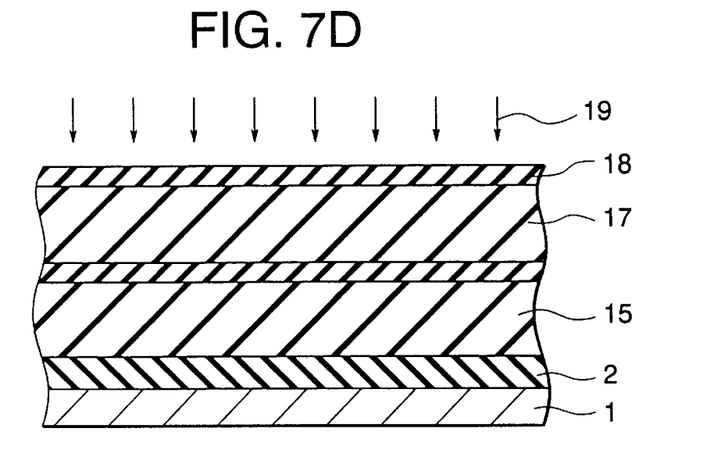

Then, as shown in FIG. 7D, oxygen ions 19 are irradiated onto the surface of the second MSQ film 17 again to reform the surface of the second MSQ film 17, whereby the second reformed layer 18 is formed. This second reformed layer 18 is a silicon oxide layer with a thickness of, for example, approximately 50 nm.

Figure 7E:
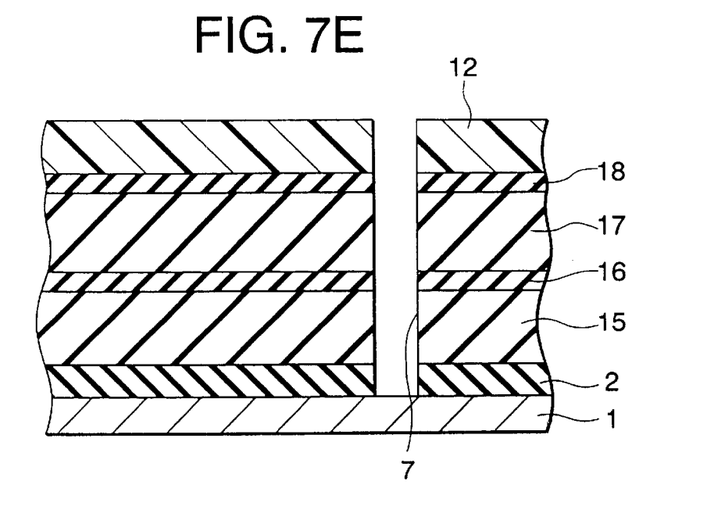

Subsequently, as shown in FIG. 7E, the first resist mask 12 is formed, and by using this first resist mask 12 as an etching mask, the second reformed layer 18, the second MSQ film 17, the first reformed layer 16, the first MSQ film 15, and the protective insulation film 2 are dry-etched in order. At this time, the second reformed layer 18, the first reformed layer 16, and the protective insulation film 2 may be dry-etched in plasma in which a mixed gas made from a $CF_4$ gas and an $O_2$ gas has been plasma-enhanced. The second MRQ film 17 and the first MSQ film 15 may be etched by means of RIE in a reactant gas in which a mixed gas made from a $C_4F_8$ gas, an $O_2$ gas, and an Ar gas has been plasma-enhanced. Thus, the via-hole 7 reaching the surface of the first wiring 1 is formed.

Figure 7F:
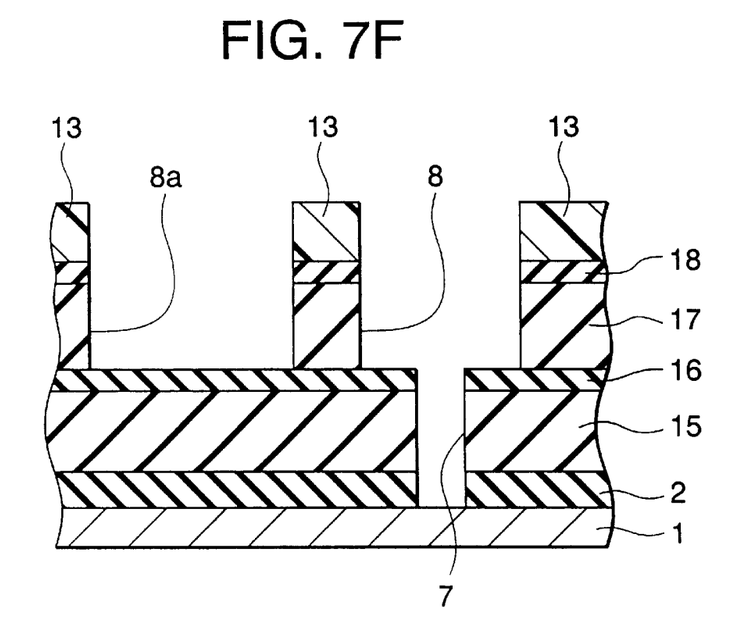

Thereafter, as shown in FIG. 7F, the second resist mask 13 having a wiring trench pattern is formed, and by using this as an etching mask, the second reformed layer 18 and the second MSQ film 17 are dry-etched. At this time, in the dry-etching of the second MSQ film 17, a reactant gas in which a mixed gas made from a $C_4F_8$ gas, an $O_2$ gas, and an Ar gas has been plasma-enhanced may be used. Then, when the ratio of content of the $O_2$ gas to the $C_4F_8$ gas is increased, the ratio of (the etching speed of the second MSQ film 17)/(the etching speed of the first reformed layer 16), that is, the etching selection ratio becomes approximately 30. Thus, in the abovementioned RIE process, the first MSQ film 15 is protected from being dry-etched by the first reformed layer 16.

Figure 7G:
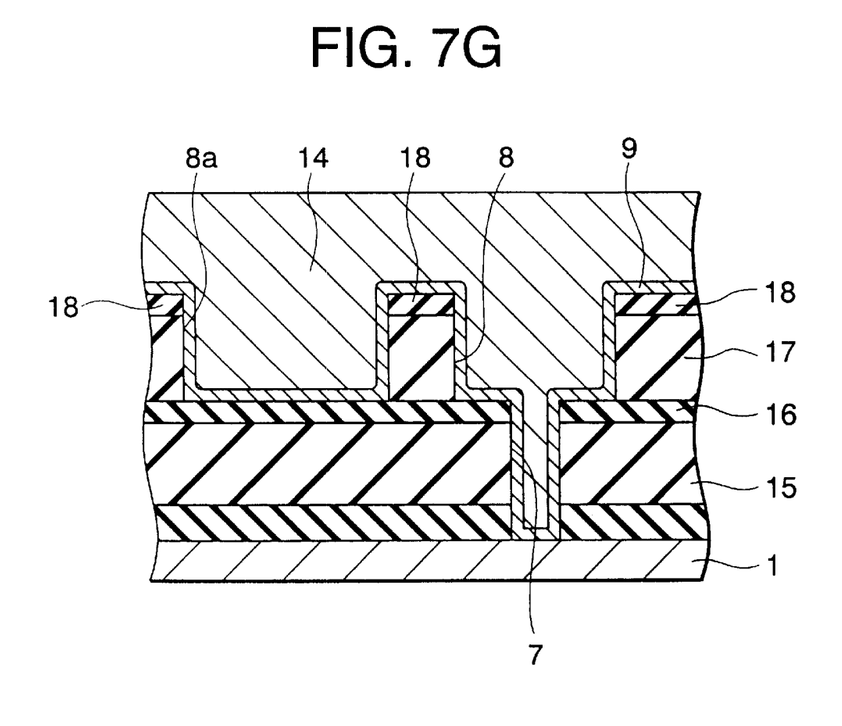

Subsequently, the second resist mask 13 is removed, and as shown in FIG. 7G, the barrier layer 9 is formed on the inner walls of the via-hole 7 and wiring trenches 8 and 8a and the surface of the second reformed layer 18. Then, the Cu film 14 with a thickness of, for example, approximately 1000 nm is deposited in the same manner as in the conventional example.

Then, not illustrated, the Cu film 14 and barrier layer 9 on the second reformed layer 18 are removed by means of CMP. In this CMP process, the second reformed layer 18 functions as a CMP stopper film to protect the second MSQ film 17 from CMP. The semiconductor device having dual damascene wiring shown in FIG. 6 is thus formed.

Figure 8A:
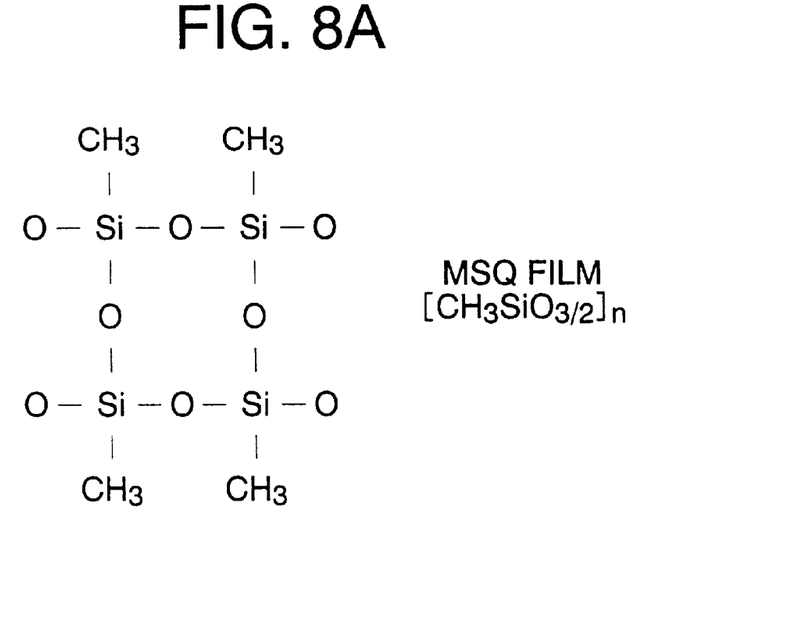
FIG. 8A is a structural formula showing an MSQ film.
Figure 8B:
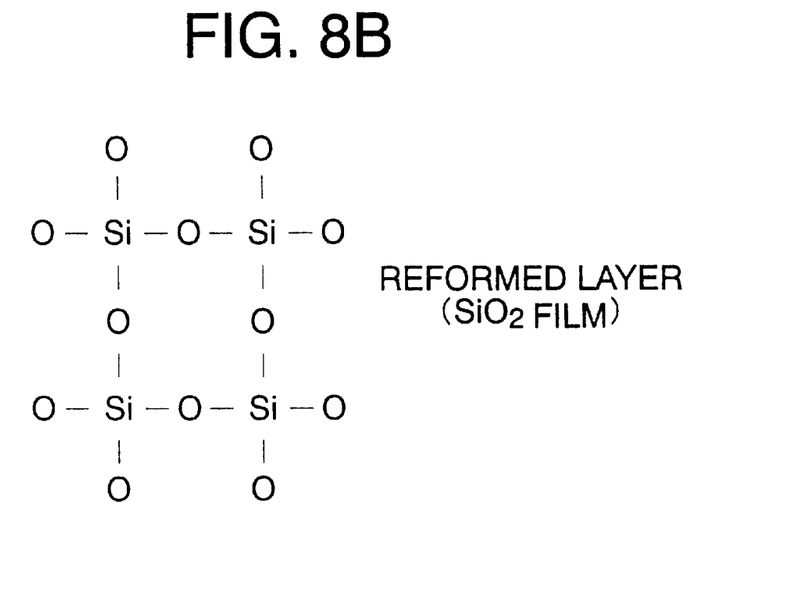
FIG. 8B is a structural formula showing a film obtained by reforming the MSQ film.

Next, the reformation of the surface of the MSQ film and its effect are explained. FIG. 8A is a structural formula showing the MSQ film, and FIG. 8B is a structural formula showing the reformed film obtained by reforming the MSQ film.

As shown in FIG. 8A, the MSQ film has the structure of $[CH_3SiO_{3/2}]n$. If a charged beam such as oxygen ions having oxidizability is irradiated onto the surface of the MSQ film, as shown in FIG. 8B, the Si—$CH_3$ bond is changed into a Si—O bond. Thus, the surface of the MSQ film is changed in composition to form a silicon dioxide ($SiO_2$) layer as a reformed layer. The relative dielectric constant of such a reformed layer is approximately 3.9.

On the other hand, the relative dielectric constant of the silicon nitride film is approximately 7.5, and the relative dielectric constant of the silicon oxynitride film is 5.5, so that the relative dielectric constant can be significantly reduced by employing the reformed layer with a relative dielectric constant of approximately 3.9 made from silicon dioxide.

Also in this case, the change from the MSQ film into the reformed layer is not rapid. The present inventors confirmed that a transition range exists between the MSQ film and the reformed film, and the MSQ film gradually changes into a reformed layer. Therefore, as in the first embodiment, the adhesion between the MSQ film and the reformed layer is extremely high.

Also, the irradiation of the oxygen ions in the present embodiment is also easily performed by plasma-enhancing an oxygen gas by the abovementioned ECR device, extracting plasma ions by an acceleration voltage of several hundreds eV, and irradiating oxygen ions having the abovementioned kinetic energy. In this case, it is effective that the semiconductor substrate is heated to approximately 100° C. Herein, it is preferable that the dosage of the plasma ions is set to $10^{14}/cm^2$ to $10^{16}/cm^2$. Also, in this case, a nitrous oxide ($N_2O$) or nitrogen monoxide gas may be used in place of the oxygen gas.

This second embodiment has the same effect as that of the first embodiment. Furthermore, the dielectric constant of this MSQ film is smaller than that of the HSQ film, and the dielectric constant of the reformed layer is smaller than that of the SRO layer. Therefore, in the semiconductor device formed by this method, a speedup of the semiconductor device is promoted since the parasitic capacitance is reduced more than in the first embodiment. The reformed layer may be the abovementioned SRO layer formed by the method similar to a method explained in the first embodiment.

In addition, in the first and second embodiments, the semiconductor devices having damascene wiring or dual damascene wiring have been described, however, the invention is not limited to these, but can be applied to an interlayer insulation film for forming normal wiring.

Furthermore, the invention can be applied in the same manner even if methylated hydrogen silsesquioxane and fluorinated silsesquioxane may also be used as the abovementioned silsesquioxanes other than the HSQ film and the MSQ film. Moreover, the interlayer insulation film whose surface is reformed as mentioned above may be composed of porous silica containing at least one bond among a Si—H bond, a Si—$CH_3$ bond, and a Si—F bond.

Furthermore, the invention is not limited to the abovementioned embodiments, but the embodiments may be modified as necessary within the scope of the technical idea of the invention.

What is claimed is:

1. A semiconductor device comprising:
   a first interlayer insulation film having a reformed layer, formed at the surface of said first interlayer insulation film, whose composition is changed from that of the inside of said interlayer insulation film; and a wiring formed on said reformed layer, wherein the transition from said first interlayer insulation film to said reformed layer has a gradual profile defined by irradiation of the first interlayer insulation film by ions;
   wherein said first interlayer insulation film is composed of silsesquioxanes or porous silica having one or more bonds selected from a group consisting of a Si—H bond, a Si—$CH_3$ bond, and a Si—F bond, and said reformed layer is composed of a silicon oxide film containing excess silicon or a silicon dioxide film.

2. A semiconductor device according to claim 1, further comprising:
   a second interlayer insulation film formed on said reformed layer;
   a wiring trench formed in said second interlayer insulation film; and
   a wiring formed by embedding a conductive material in said wiring trench.

3. A semiconductor device according to claim 1, further comprising:
   a second interlayer insulation film having a second reformed layer, formed at the surface of said second interlayer insulation film, whose composition is changed from that of the inside of said second interlayer insulation film;
   a wiring trench formed in said second interlayer insulation film; and
   a wiring formed by embedding a conductive material in said wiring trench.

4. A semiconductor device according to claim 1, further comprising:
   a via-hole formed in said first interlayer insulation film;
   a via-hole formed by embedding a conductive material in said via-hole;
   a second interlayer insulation film having a reformed layer, formed at the surface of said second interlayer insulation film, whose composition is changed from that of the inside of said second interlayer insulation film;
   a wiring trench formed in said second interlayer insulation film; and
   a wiring formed by embedding the conductive material in said wiring trench.

5. A semiconductor device according to claim 1, wherein said silsesquioxanes is composed of one or more kinds selected from a group consisting of hydrogen silsesquioxane, methyl silsesquioxane, methylated hydrogen silsesquioxane, and fluorinated silsesquioxane.

6. A semiconductor device comprising:

a first interlayer insulation film having a reformed layer, formed at the surface of said first interlayer insulation film, whose composition is changed from that of the inside of said interlayer insulation film; and a wiring formed on said reformed layer, wherein the transition from said first interlayer insulation film to said reformed layer has a gradual profile defined by irradiation of the first interlayer insulation film by ions;

wherein said ions are argon ions.

7. A semiconductor device comprising:

a first interlayer insulation film having a reformed layer, formed at the surface of said first interlayer insulation film, whose composition is changed from that of the inside of said interlayer insulation film; and a wiring formed on said reformed layer, wherein the transition from said first interlayer insulation film to said reformed layer has a gradual profile defined by irradiation of the first interlayer insulation film by ions;

wherein said ions are oxygen ions.

* * * * *